United States Patent [19]
Buhler et al.

[11] Patent Number: 5,742,047
[45] Date of Patent: Apr. 21, 1998

[54] HIGHLY UNIFORM FIVE VOLT CMOS IMAGE PHOTODIODE SENSOR ARRAY WITH IMPROVED CONTRAST RATIO AND DYNAMIC RANGE

[75] Inventors: Steven A. Buhler, Sunnyvale; Mehrdad Zomorrodi, West Hills, both of Calif.

[73] Assignee: Xerox Corporation, Stamford, Conn.

[21] Appl. No.: 723,085

[22] Filed: Oct. 1, 1996

[51] Int. Cl.$^6$ .................................... H01J 40/14
[52] U.S. Cl. ........................ 250/214 R; 250/208.1; 327/514
[58] Field of Search ............... 250/214 R, 208.1; 327/514, 515, 108, 109, 111, 427, 434, 437

[56] References Cited

U.S. PATENT DOCUMENTS 4,902,886  2/1990  Smisko ..................... 250/214 R
5,081,536  1/1992  Tandon et al. ................ 348/313

OTHER PUBLICATIONS

IEEE Journal of Solid State Circuits, vol. 26, No. 8 pp. 1116–1122, published in Aug. 1991 in an article by Mikio Kyomasu titled "A New MOS Imager Using Photodiode as Current Source."

IEEE Transactions Electron Devices, vol. 39, No. 11, pp. 2497–2507, in an article by Jaroslav Hynecek titled, "Theoretical Analysis and Optimization of CDS Signal Processing Method for CCD Image Sensors", Nov. 1992.

*Primary Examiner*—Edward P. Westin
*Assistant Examiner*—Kevin Pyo
*Attorney, Agent, or Firm*—Nola Mae McBain

[57] ABSTRACT

An imager using an array of photodiodes that does not require non-standard voltages nor multiphase clocking schemes and retains good linearity with low fixed pattern and random noise generation while requiring a minimum of silicon area is described.

2 Claims, 2 Drawing Sheets

HIGHLY UNIFORM FIVE VOLT CMOS IMAGE PHOTODIODE SENSOR ARRAY WITH IMPROVED CONTRAST RATIO AND DYNAMIC RANGE

BACKGROUND

This invention relates generally to sensor arrays and more particularly concerns a CMOS sensor array in which a photodiode array is used for an imager.

Image sensor arrays have long been constructed using CCD arrays. To construct an image sensor array using photodiodes would have the advantages of being able to construct signal processing and amplification on a single chip. However, CCD arrays have been preferred over photodiode arrays because in the past photodiode arrays were not considered viable due to sensitivity, dynamic range, and fixed pattern noise problems.

A MOS imager using a photodiode as a current source is described in the IEEE Journal of Solid State Circuits, volume 26, number 8, pages 1116–1122, published in August 1991 in an article by Mikio Kyomasu titled "A New MOS imager Using Photodiode as Current Source." This article describes an imager that uses two transfer gates connected to a photodiode, one to maintain a constant bias voltage except during discharge periods and the other to separate capacitive load from parasitic capacitance. The transfer gates are implemented using NMOS transistors. The NMOS implementation requires non-standard voltages of between 5.4 volts and 7 volts for the transfer gates to operate properly. This creates additional circuit complexity.

This device also has the undesirable characteristic of fixed-pattern noise due to a threshold voltage mismatch in the MOS transistor. The fixed-pattern noise is compensated for by using a Correlated Double Sampling (CDS) technique implemented with a source-follower circuit utilizing two source followers. The dual source followers add to the overall nonlinearity of the circuit and require increased silicon area.

Another, typical, correlated double sampling circuit is described in the IEEE Transactions Electron Devices, volume 39, number 11, pages 2497–2507, in an article by Jaroslav Hynecek titled, "Theoretical Analysis and Optimization of CDS Signal Processing Method for CCD Image Sensors". Again the circuit is implemented using two source followers, a decoupling capacitor and a sample and hold capacitor. This circuitry requires multiphase clocking and again the dual source followers add to overall nonlinearity of the circuit and requires increased silicon area.

Accordingly, it is the primary aim of the invention to provide an imager using an array of photodiodes that does not require non-standard voltages nor multiphase clocking schemes and retains good linearity with low fixed pattern and random noise generation while requiring a minimum of silicon area.

Further advantages of the invention will become apparent as the following description proceeds.

SUMMARY OF THE INVENTION

Briefly stated and in accordance with the present invention, there is provided a photodiode sensor circuit that receives light input into a photodiode that produces an electronic current output that varies according to the intensity of the light input. The photodiode acts as a constant current source with the value of the current dependent on how much light is received by the diode. The diode is followed by a single stage transfer circuit that uses only 5 volt clock signals and which produces an electronic output according to the input received. The single stage transfer circuit comprises of three transistors, an NMOS a pass transistor and a PMOS pull-up. The single stage transfer circuit is followed by a standard source follower circuit for receiving the electronic output from the single stage transfer circuit and which produces an electronic output according to the input received. The source-follower circuit is followed a correlated double sampling circuit for elimination of pattern noise which receives the electronic output from the single source follower and produces an electronic output according to the input received, and finally a buffer that receives the output from the sample and hold circuit and produces a buffered output.

Figure 1:
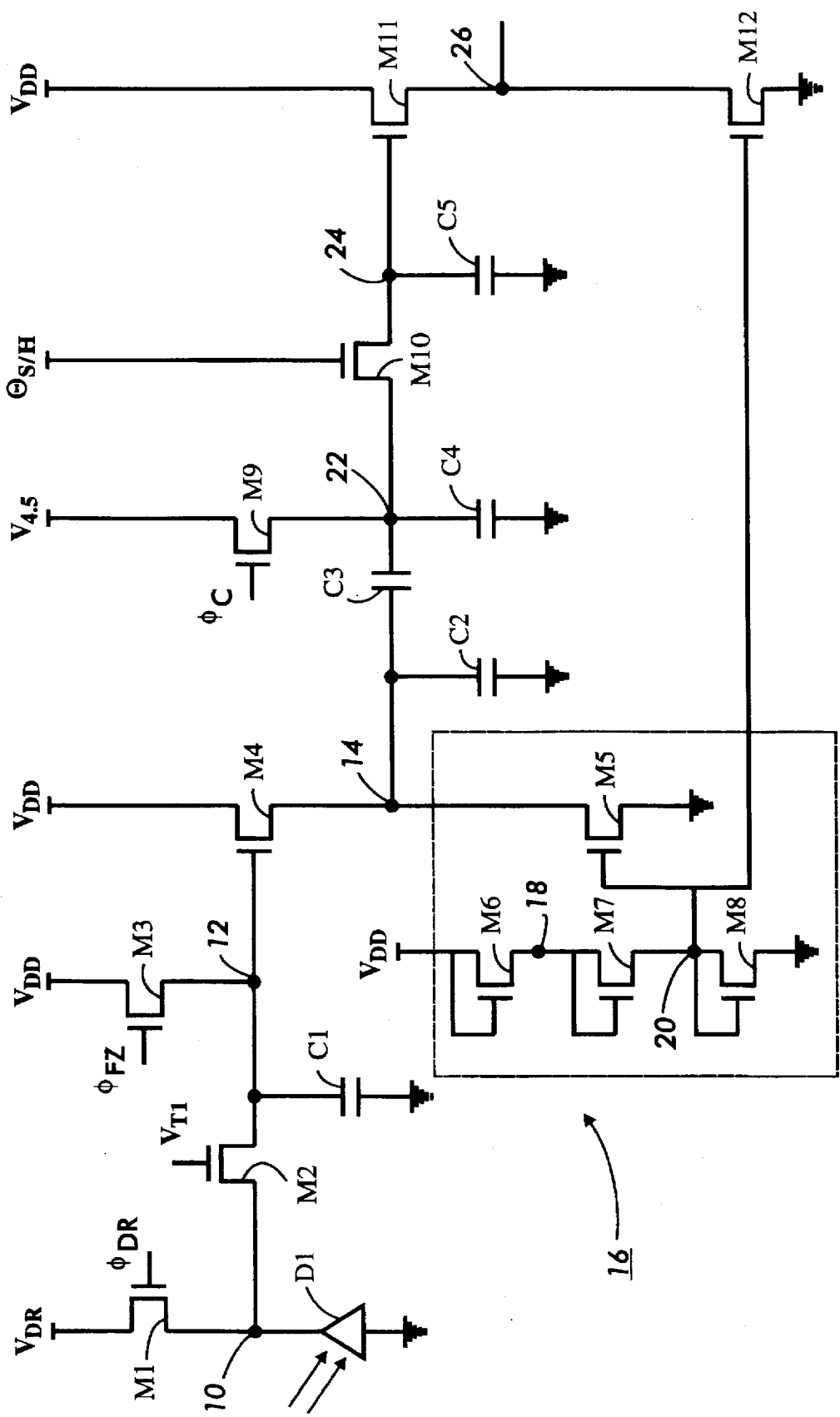
FIG. 1 is a schematic diagram of an imager using a photodiodes.

While the present invention will be described in connection with a preferred embodiment and method of use, it will be understood that it is not intended to limit the invention to that embodiment or procedure. On the contrary, it is intended to cover all alternatives, modifications and equivalents as may be included within the spirit and scope of the invention as defined by the appended claims.

Alpha-Numeric List of Elements

C1 capacitor
C2 capacitor
C3 capacitor
C4 capacitor
C5 capacitor
D1 photodiode
M1 MOS transistor
M2 pass transistor
M3 reset gate
M4 source-follower MOS transistor
M5 MOS transistor
M6 MOS transistor
M7 MOS transistor
M8 MOS transistor
M9 clamping transistor
M10 transfer gate
M11 buffer transistor
M12 MOS transistor
$V_{dd}$ a supply voltage
$V_{dr}$ diode reset voltage
$V_{4.5}$ clamping supply voltage
$\phi_c$ clamping clock
$\phi_{dr}$ diode reset clock
$\phi_{fz}$ fat zero reset clock
$V_{t1}$ transfer gate voltage
$\phi_{sh}$ sample/hold clock
10 node
12 node
14 node
16 current source
18 node
20 node
22 node
24 node
30 diode reset clock waveform
32 fat zero reset clock waveform 34 clamping clock waveform
36 sample/hold clock waveform

DETAILED DESCRIPTION OF THE INVENTION

Turning now to FIG. 1, a circuit diagram is shown for a sensor array that utilizes photodiodes and has the advantages of the invention. It should be noted that while an imager will use an array of photodiodes, for ease of description only one photodiode and its associated circuitry is shown. To create a full array, the circuit shown in FIG. 1 would be replicated. A photodiode D1 is reverse biased. A NMOS transistor M1 is electrically connected between the n-type side of the photodiode D1 at node 10 and a diode reset voltage $V_{dr}$. The MOS transistor M1 is gated by a diode reset clock $\phi_{dr}$ allowing the photodiode D1 to be reset to the diode reset voltage $V_{dr}$ (1.5 volts ±5%). Also connected at node 10 is a second NMOS transistor that is connected as pass transistor M2 and gated by DC transfer gate voltage $V_{t1}$.

Connected to the other side of pass transistor M2 at node 12 is a reset gate M3, capacitor C1 and source-follower NOS transistor M4. Capacitor C1 is connected between node 12 and ground and it should be noted that capacitor C1 does not represent a discrete component but rather the gate capacitance of source-follower MOS transistor M4. Reset gate M3 is connected between node 12 and supply voltage $V_{dd}$. Reset gate M3 has a fat zero reset clock $\phi_{fz}$ as input to its gate. Source-follower MOS transistor M4 while receiving its gate input from node 12 is connected between supply voltage $V_{dd}$ and node 14.

Also connected to node 14 are capacitors C2 and C3 and MOS transistor M5 that is part of a group of transistors forming a current source 16. The current source 16 is comprised of MOS transistors M5, M6, M7, and M8 in a standard current source configuration as is known in the art with the MOS transistors M6, M7, and M8 connected in serial between the supply voltage $V_{dd}$ and ground, each MOS transistor M6, M7, and M8 arranged in a diode configuration with its gate connected to its source. MOS transistor M6 has both its gate and drain connections electrically connect to the supply voltage $V_{dd}$. MOS transistor M8 has its source connection electrically connected to ground, and MOS transistor M7 is interposed between MOS transistor M6 and MOS transistor M8 with its gate and drain electrically connected to the source of MOS transistor M6 at node 18 and its source electrically connected to the gate and drain of MOS transistor M8 at node 20. MOS transistor M5 is connected between node 14 and ground with its gate input electrically connected to node 20.

Capacitor C2 is connected between node 14 and ground. Capacitor C3 acts as a decoupling capacitor between node 14 and node 22. Node 22 has, in addition to the capacitor C3, a clamping transistor M9, a transfer gate M10, and a capacitor C4. Capacitor C2 represents the bottom plate, well to substrate parasitic capacitance of capacitor C3 and not a discrete element. Capacitor C4 represents the parasitic capacitance at node 22, primarily composed of top plate parasitic capacitance of capacitor C3 and junction capacitance. Capacitor C3 will be larger than capacitor C4.

The clamping transistor M9 is connected between a clamping supply voltage $V_{4.5}$ of 4.5 volts and node 22. The clamping transistor M9 receives its gate input from a clamping clock $\phi_c$.

The capacitor C4 is connected between node 22 and ground. Transfer gate M10 is connected between node 22 and node 24. Transfer gate M10 receives its gate input from sample/hold clock $\phi_{sh}$, and acts as a sampling transistor.

At node 24 the signal sampled by the transfer gate M10 at node 22 is stored in capacitor C5. Capacitor C5 is therefore connected between node 24 and ground and represents the parasitic gate capacitance of MOS transistor M11. Capacitor C5 will be smaller than both capacitor C3 and capacitor C4. Also connected to node 24 is a gate input to a buffer transistor M11. Buffer transistor M11 is connected between the source voltage $V_{dd}$ and node 26. Node 26 is also the buffered output node for the circuit. In addition to buffer transistor M11, MOS transistor M12 is also connected to node 26. MOS transistor M12 is connected between node 26 and ground and receives its gate input voltage from node 20. MOS transistor M12 works with MOS transistors M6, M7, & M8 to provide a current source to node 26 in exactly the same fashion as MOS transistor M5 works with MOS transistors MG, M7, & M8 to provide a current source to node 14.

The construction of the circuit having been described, attention will now be given to explaining the advances of this circuit.

The first advancement is the use of a single stage transfer between photodiode D1 and source-follower MOS transistor M4. This single stage transfer is pass transistor M2. Pass transistor M2 is designed to insure that when pass transistor M2 is in operation it will operate only in its saturation region thus allowing constant current from photodiode D1, which is induced by light, to pass through it. Operating pass transistor M2 only within its saturation region allows the pass transistor M2 to keep developing a voltage signal across the input capacitance of source-follower MOS transistor M4, which includes capacitor C1.

Single stage transfer techniques have been used before, however, they have required the use of multiple phased clocks and non-standard voltages to establish saturation conditions. The use of multiple phased, non-standard voltage level clocks increase both the noise sensitivity and complexity of the resultant circuitry. In this implementation both the clamping clock $\phi_c$ and the diode reset clock $\phi_{fz}$ use standard digital 5 volt signals. This is possible because reset gate M3 is chosen to be a PMOS transistor. Using a PMOS transistor for reset gate M3 means that the reset gate only needs a standard digital input of 5 volts instead of the typical but nonstandard voltage requirements of 7 volts or 5.4 volts needed in other implementations. Using non-standard voltage requirements of 7 volts or 5.4 volts increases the circuit complexity.

The second advancement is shown in the area of correlated double sampling used to eliminate fixed pattern noise. Correlated double sampling is a known technique for eliminating fixed pattern noise that is commonly used, however known correlated double sampling techniques require an implementation using two source follower arrangements. Using two source follower arrangements requires multiphase clocking that adds to circuit complexity, requires a large silicon area and the non-linearities associated with each source follower add to the overall non-linearity of the circuit. In this circuit correlated double sampling is implemented using only one source-follower MOS transistor M4. This is achieved because capacitor C3 functions as both the sample and hold capacitance and the decoupling capacitance. Combining both functions into one capacitor C3 is possible because capacitor C3 is implemented as a poly-oxide-N-well capacitor that requires a minimal amount of space while providing a minimal amount of parasitic capacitances at nodes 14 and 23.

Figure 2:
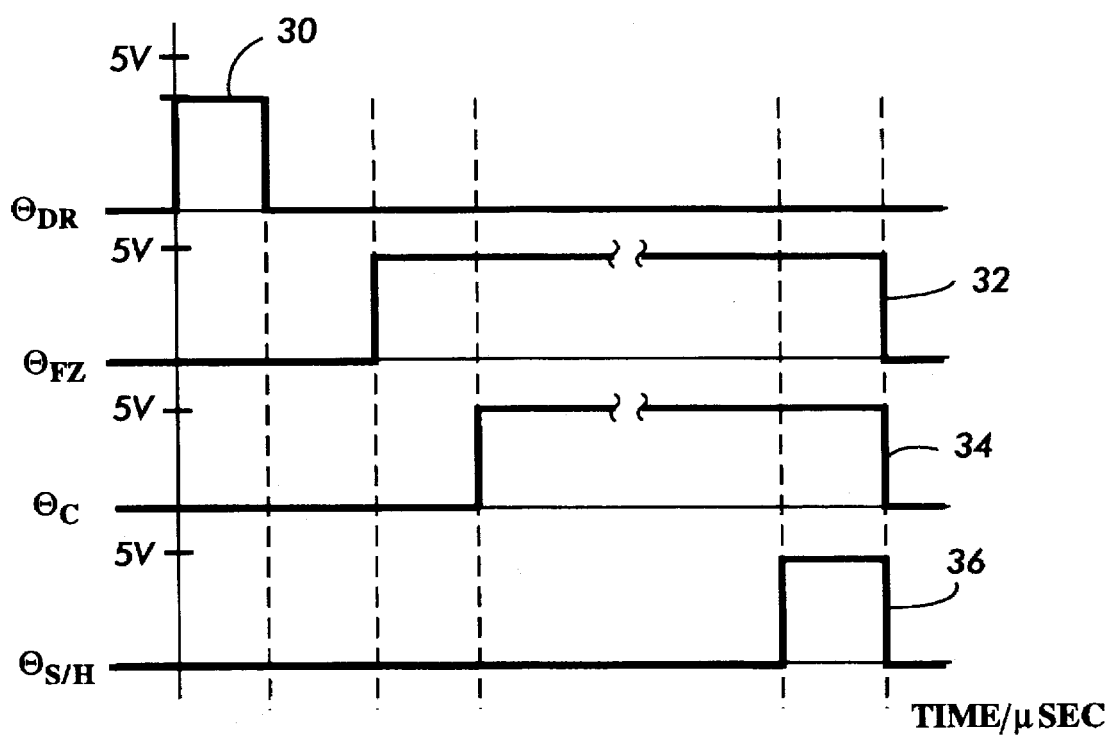
FIG. 2 is a timing diagram for the schematic shown in FIG. 1.

Turning now to FIG. 2 a timing diagram for the circuit is shown. The horizontal axis represents time in microseconds.

The timing for clamping clock $\phi_c$, diode reset clock $\phi_{dr}$, fat zero reset clock $\phi_{fz}$ hand sample/hold clock $\phi_{sh}$ are shown relative to each other. All signals switch between a standard DC voltage of 5 volts ±5% and ground and one complete cycle is shown. A diode reset clock waveform 30, a fat zero reset clock waveform 32, a clamping clock waveform 34, and a sample/hold clock waveform 36 is shown.

The diode reset clock waveform 30 rises to 5 volts at 0 microseconds, holds high for 2 microseconds and then drops back to zero volts at 2 microseconds.

After a small delay of at lease 10 nanoseconds, although a delay of 2 microseconds is shown in FIG. 2, the fat zero reset clock waveform 32 rises from zero volts to 5 volts and holds high for a period of time known as the integration time. The integration time will vary depending on the individual circuit but will be defined by the circuit process technology, pixel size, light intensity, scanning speed, and clock speed. The fat zero reset clock waveform 32 must be held low long enough to allow reset gate M3 to turn on.

After a small delay of at least 10 nanoseconds, although a delay of 2 microseconds is shown in FIG. 2, after the fat zero reset clock waveform 32 rises, the clamping clock waveform 34 rises from zero volts to 5 volts. The clamping clock waveform 34 remains at 5 volts until the end of the integration time, and drops to zero volts again at the same time the clamping clock waveform 34 drops to zero volts.

Towards the end of the integration time, the sample/hold clock waveform 36 rises to 5 volts from zero volts and then drops back to zero volts with the clamping clock waveform 34 and the fat zero reset clock waveform 32. The fat zero reset clock waveform must remain low for a minimum of 100 nanoseconds before rising back to 5 volts although a time of 2 microseconds is shown in FIG. 2. The sample/hold clock waveform 36 must remain high long enough to transfer any signal from capacitor C3 to capacitor C5. However, the time to transfer the signal needs to be short enough to implement a desired fast scanning speed. This will be affected by the relative sizes of capacitors C3 and C5 and require that capacitor C5 be as small as possible to implement fast scanning speeds.

We claim:

1. A photodiode sensor circuit comprising:
   A) a photodiode which receives light input and produces an electronic current output which varies according to the intensity of the light input,
   B) a single stage transfer circuit using only 5 volt clock signals for receiving the electronic output from the photodiode which produces an electronic output according to the input received comprising,
      i) an NMOS pull-up with a gate terminal, a drain terminal, and a source terminal,
      ii) a pass transistor with a gate terminal, a drain terminal, and a source terminal,
      iii) a PMOS pull-up with a gate terminal, a drain terminal, and a source terminal, and
      iv) the drain terminal of the NMOS pull-up and the drain terminal of the pass transistor are electrically connected to each other and to the electronic output of the photodiode, the source terminal of the pass transistor and the source terminal of the PMOS pull-up are connected to each other and provide the electronic output for the single stage transfer circuit,
   C) a source follower circuit for receiving the electronic output from the single stage transfer circuit and which produces an electronic output according to the input received,
   D) a correlated double sampling circuit for elimination of pattern noise which receives the electronic output from the single source follower and produces an electronic output according to the input received, and
   E) a buffer which receives the output from the correlated double sampling circuit and produces a buffered output.

2. The photodiode sensor circuit of claim 1 wherein the correlated double sampling circuit comprises,
   a) a capacitor, with an input terminal for receiving and electrical signal and an output terminal for delivering an electrical signal,
   b) a clamping transistor with a gate terminal, a drain terminal, and a source terminal,
   c) a transfer gate with a gate terminal, a drain terminal, and a source terminal,
   d) the input to the capacitor receives the electronic input to the correlated double sampling circuit from the source follower circuit,
   e) the output of the capacitor is electronically connected to drain of the clamping transistor, and the drain of the transfer gate, and
   f) the source of the transfer gate is electrically connected to the buffer circuit and provides the output for the correlated double sampling circuit.

* * * * *